(12) United States Patent
Chen et al.

(10) Patent No.: US 10,629,851 B2
(45) Date of Patent: Apr. 21, 2020

(54) OLED THIN FILM ENCAPSULATION STRUCTURE

(71) Applicant: WUHAN CHINA STAR OPTOELECTRONICS TECHNOLOGY CO., LTD., Hubei (CN)

(72) Inventors: Yung Sheng Chen, Hubei (CN); Hsiang Lun Hsu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 300 days.

(21) Appl. No.: 15/313,920

(22) PCT Filed: Sep. 9, 2016

(86) PCT No.: PCT/CN2016/098560
§ 371 (c)(1),
(2) Date: Nov. 23, 2016

(87) PCT Pub. No.: WO2018/023855
PCT Pub. Date: Feb. 8, 2018

(65) Prior Publication Data
US 2018/0183009 A1    Jun. 28, 2018

(30) Foreign Application Priority Data

Aug. 2, 2016 (CN) .......................... 2016 1 0623611

(51) Int. Cl.
*H01L 51/50* (2006.01)
*H01L 51/52* (2006.01)
*H01L 51/56* (2006.01)

(52) U.S. Cl.
CPC .......... *H01L 51/5275* (2013.01); *H01L 51/52* (2013.01); *H01L 51/5253* (2013.01);
(Continued)

(58) Field of Classification Search
CPC ..... H01L 51/5256; H01L 51/50; H01L 51/52; H01L 51/5237–5278; H01L 51/00–56
See application file for complete search history.

(56) References Cited

U.S. PATENT DOCUMENTS 10,181,578 B2 * 1/2019 Li ........................... H01L 51/56
2012/0256201 A1 10/2012 Lee
(Continued)

FOREIGN PATENT DOCUMENTS

| CN | 102179971 A | 9/2011 |
| CN | 104900812 A | 9/2015 |

(Continued)

OTHER PUBLICATIONS

English abstract translation of EP 2136423.
(Continued)

*Primary Examiner* — Shaun M Campbell
*Assistant Examiner* — Suberr L Chi
(74) *Attorney, Agent, or Firm* — WPAT, PC

(57) ABSTRACT

An OLED thin film encapsulation structure and a method of fabricating the same are provided. The OLED thin film encapsulation structure has: a substrate, a first organic layer disposed on the substrate; a first inorganic layer which is a hydrophobic layer; a second organic layer; a second inorganic layer which is disposed on the first inorganic layer and the second organic layer, and is a hydrophobic layer; and a plurality of first protrusions disposed with intervals on the first organic layer and/or the second organic layer.

5 Claims, 5 Drawing Sheets

(52) U.S. Cl.
CPC ...... *H01L 51/5256* (2013.01); *H01L 51/5268* (2013.01); *H01L 51/56* (2013.01); *H01L 2251/558* (2013.01)

(56) References Cited

U.S. PATENT DOCUMENTS

| | | |
|---|---|---|
| 2012/0256202 A1 | 10/2012 | Lee |
| 2014/0093700 A1 | 4/2014 | Han et al. |
| 2017/0117504 A1* | 4/2017 | Kim ................... H01L 27/3244 |
| 2017/0133632 A1 | 5/2017 | Yang et al. |
| 2017/0338443 A1* | 11/2017 | Lee ................... H01L 51/5275 |

FOREIGN PATENT DOCUMENTS

| | | | |
|---|---|---|---|
| CN | 105140417 A * | 12/2015 | ............. H01L 51/56 |
| CN | 105405982 A | 3/2016 | |
| EP | 2136423 A1 | 12/2009 | |
| WO | WO 2016/105029 A1 * | 6/2016 | |

OTHER PUBLICATIONS

English abstract translation of CN 102179971.
English abstract translation of CN 104900812.
English abstract translation of CN 105405982.
Office Action from Chinese Patent Office, application No. 201610623611.0 dated Jun. 2, 2017.

\* cited by examiner

OLED THIN FILM ENCAPSULATION STRUCTURE

FIELD OF THE INVENTION

The present invention relates to a thin film encapsulation field, and more particularly to an OLED thin film encapsulation structure and a method of fabricating the same.

BACKGROUND OF THE INVENTION

Because stacking organic in organic film layers in an OLED thin film encapsulation structure are all dispelling water oxide film layers, there is no effect of increasing light. Further, due to a viscosity relationship in the organic film layer of the thin film encapsulation structure, a surface of the film layer is relatively flat, and a refractive index is mostly fixed between 1.5 and 1.6. Therefore, an optical effect has a little effect, and the effect of increasing light is relatively poor.

As a result, there are defects in the conventional technology, which require to be improved.

SUMMARY OF THE INVENTION

An object of the present invention is to provide an OLED thin film encapsulation structure and a method of fabricating the same, so as to solve the technical problem of the poor effect of increasing light of the conventional OLED thin film encapsulation structure.

To achieve the above object, the present invention provides an OLED thin film encapsulation structure, comprising:
   a substrate;
   a first organic layer disposed on the substrate;
   a first inorganic layer disposed on the first organic layer and the substrate, wherein the first inorganic layer is a hydrophobic layer;
   a second organic layer disposed on the first inorganic layer;
   a second inorganic layer disposed on the first inorganic layer and the second organic layer, wherein the second inorganic layer is a hydrophobic layer; and
   a plurality of first protrusions disposed with intervals on the first organic layer and/or the second organic layer.

In the OLED thin film encapsulation structure described by the present invention, the first protrusions are spherical, semi-spherical, spheroidal, or semi-ellipsoidal in shape.

In the OLED thin film encapsulation structure described by the present invention, the first protrusions are arranged in a rectangular array.

In the OLED thin film encapsulation structure described by the present invention, the plurality of protrusions are disposed with the intervals on the first organic layer, a plurality of second protrusions are disposed on a surface of the first inorganic layer away from the first organic layer, and each of the second protrusions is aligned with and facing one of the first protrusions; a surface of the second organic layer facing the first inorganic layer is formed with a plurality of first grooves disposed, each of the second protrusions is aligned with and fitted with one of the first grooves, and each of the second protrusions is correspondingly received in one of the first grooves, respectively.

In the OLED thin film encapsulation structure described by the present invention, the plurality of first protrusions are disposed with intervals on the second organic layer, a plurality of third protrusions is disposed on a surface of the second inorganic layer away from the second organic layer, and each of the third protrusions is aligned with and facing one of the first protrusions.

The present invention provides an OLED thin film encapsulation structure, comprising:
   a substrate;
   a first organic layer disposed on the substrate;
   a first inorganic layer disposed on the first organic layer and the substrate, wherein the first inorganic layer is a hydrophobic layer;
   a second organic layer disposed on the first inorganic layer;
   a second inorganic layer disposed on the first inorganic layer and the second organic layer, wherein the second inorganic layer is a hydrophobic layer; and
   a plurality of first protrusions disposed with intervals on the first organic layer and/or the second organic layer,
   wherein the first protrusions are spherical, semi-spherical, spheroidal, or semi-ellipsoidal shape in shape;
   wherein the first protrusions are arranged in a rectangular array;
   wherein a plurality of second protrusions are disposed on a surface of the first inorganic layer away from the first organic layer, and each of the second protrusions is aligned with and facing one of the first protrusions; a surface of the second organic layer facing the first inorganic layer is formed with a plurality of first grooves disposed, each of the second protrusions is aligned with and fitted with one of the first grooves, and each of the second protrusions is correspondingly received in one of the first grooves, respectively.

The present invention further provides a method of fabricating an OLED thin film encapsulation structure, comprising steps of:
   forming a first organic layer on a substrate;
   forming a first inorganic layer on the first organic layer and the substrate, wherein the first inorganic layer is a hydrophobic layer;
   forming a second organic layer on the first inorganic layer;
   forming a second inorganic layer on the first inorganic layer and the second organic layer, wherein the second inorganic is a hydrophobic layer; and
   a plurality of first protrusions disposed with intervals on the first organic layer and/or the second organic layer.

In the method of fabricating the OLED thin film encapsulation structure described by the present invention, the first protrusions are spherical, semi-spherical, spheroidal, or semi-ellipsoidal in shape.

In the method of fabricating the OLED thin film encapsulation structure described by the present invention, the plurality of protrusions are disposed with the intervals on the first organic layer, a plurality of second protrusions are disposed on a surface of the first inorganic layer away from the first organic layer, and each of the second protrusions is aligned with and facing one of the first protrusions; a surface of the second organic layer facing the first inorganic layer is formed with a plurality of first grooves disposed, each of the second protrusions is aligned with and fitted with one of the first grooves, and each of the second protrusions is correspondingly received in one of the first grooves, respectively.

In the method of fabricating the OLED thin film encapsulation structure described by the present invention, the plurality of first protrusions are disposed with intervals on the second organic layer, a plurality of third protrusions is disposed on a surface of the second inorganic layer away from the second organic layer, and each of the third protrusions is aligned with and facing one of the first protrusions.

In the method of fabricating the OLED thin film encapsulation structure described by the present invention, the first protrusions are arranged in a rectangular array. In comparison with the conventional technology, microstructures are formed by disposing a plurality of first protrusions on the first organic layer or the second organic layer in the OLED thin film encapsulation structure in an embodiment of the present invention of the present preferred embodiments, so as to achieve the purposes of increasing a brightness of light emitting and improving an efficiency of light emitting.

To make the above description of the present invention more clearly comprehensible, it is described in detail below in examples of preferred embodiments with the accompanying drawings.

DETAILED DESCRIPTION OF THE PREFERRED EMBODIMENTS

The following description of the embodiments with reference to the appended drawings is used for illustrating specific embodiments which may be used for carrying out the present invention. The directional terms described by the present invention, such as "upper", "lower", "front", "back", "left", "right", "inner", "outer", "side", etc., are only directions by referring to the accompanying drawings. Thus, the used directional terms are used to describe and understand the present invention, but the present invention is not limited thereto.

In the figures, elements with similar structures are indicated by the same numbers.

The present invention provides an OLED thin film encapsulation structure, comprising:
- a substrate;
- a first organic layer disposed on the substrate;
- a first inorganic layer disposed on the first organic layer and the substrate, wherein the first inorganic layer is a hydrophobic layer;
- a second organic layer disposed on the first inorganic layer;
- a second inorganic layer disposed on the first inorganic layer and the second organic layer, wherein the second inorganic layer is a hydrophobic layer; and
- a plurality of first protrusions disposed with intervals on the first organic layer and/or the second organic layer.

Figure 1:
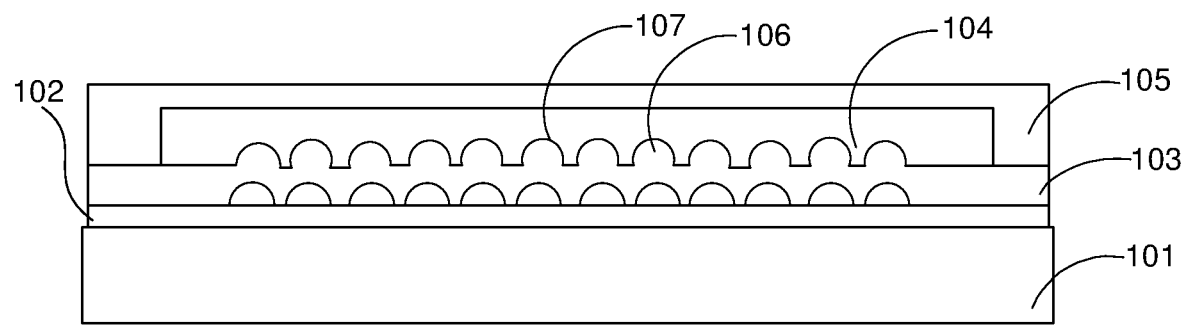
FIG. 1 is a structural schematic diagram of an OLED thin film encapsulation structure in a first preferred embodiment of the present invention.

Please refer to FIG. 1, which is a structural schematic diagram of an OLED thin film encapsulation structure in a first preferred embodiment of the present invention. The OLED thin film encapsulation structure of the present preferred embodiment comprises a substrate 101, a first organic layer 102, a first inorganic layer 103, a second organic layer 104, and a second inorganic layer 105.

In the embodiment, the substrate 101 is a glass substrate, or a plastic transparent substrate.

In the embodiment, the first organic layer 102 is disposed on the substrate 101. Specifically, the first organic layer 102 consists of a plurality of first protrusions with intervals and arranged in an array. The first protrusions can be spherical, semi-spherical, spheroidal, or semi-ellipsoidal in shape, which are formed and printed by using an ink spray printing machine. Further, a curing device is disposed near a nozzle of the ink spray printing machine, such that the nozzle can print and a curing can be performed simultaneously. A thickness of the first organic layer 102 is ranged from 100 nm to 1000 nm. The first inorganic layer 103 is disposed on the first organic layer 102 and the substrate 101. The first inorganic layer 103 is a hydrophobic layer but may be a dispelling water oxide film layer, which is formed by using an atomic layer deposition technology or a chemical vapor deposition technology. A thickness of the hydrophobic layer is ranged from 400 nm to 4000 nm. A plurality of second protrusions are disposed on a surface of the first inorganic layer 102 away from the first organic layer 103, and each of the second protrusions 106 is aligned with and facing one of the first protrusions. In the present embodiment, the second protrusions 106 are hemispherical or semi-ellipsoidal in shape.

The second organic layer 104 is disposed on the first inorganic layer 103. The second organic layer 104 is formed by using methods of printing, IJP, spray, coating and so on, which has a thickness ranged from 100 nm to 1000 nm. A surface of the second organic layer facing the first inorganic layer is formed with a plurality of first grooves 107 disposed, each of the second protrusions 106 is aligned with and fitted with one of the first grooves 107. A refractive index of the first organic layer 102 is different from that of the second organic layer. Specifically, an average of an refractive index of any neighboring two first protrusions in each of the first protrusions is identical to an refractive index of the second organic layer 104, and a deviation value of the refractive index of each of the first protrusions relative to the second organic layer 104 is between 3% and 5% of the refractive index of the second organic layer 104.

The second inorganic layer 105 is disposed on the first inorganic layer 103 and the second organic layer 104. The second inorganic layer is a hydrophobic layer, which is formed by using an atomic layer deposition technology or a chemical vapor deposition technology. A thickness of the hydrophobic layer is ranged from 400 nm to 4000 nm.

From above, microstructures are formed by disposing a plurality of first protrusions on the first organic layer in the OLED thin film encapsulation structure in an embodiment of the present invention, so as to achieve the purposes of increasing a brightness of light emitting and improving an efficiency of light emitting.

Figure 2:
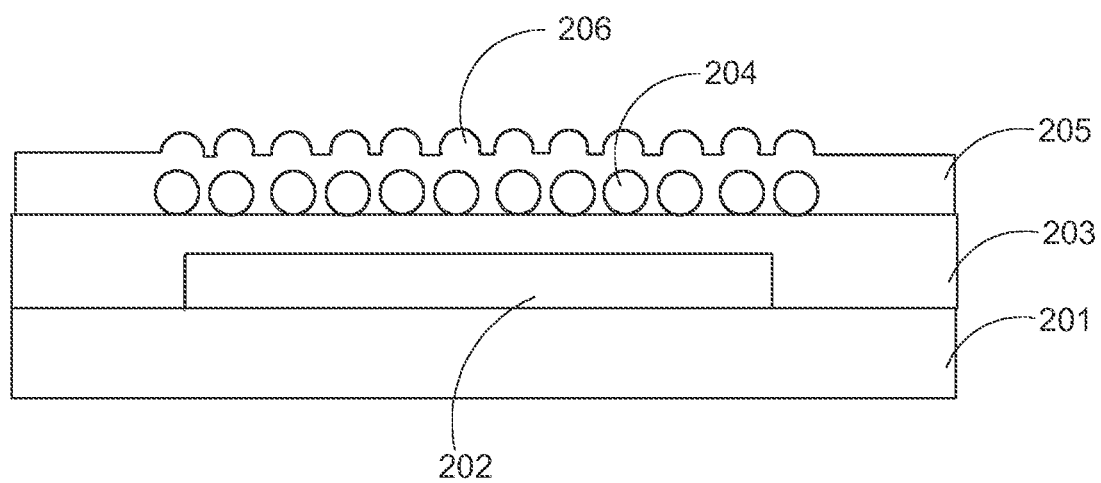
FIG. 2 is a structural schematic diagram of an OLED thin film encapsulation structure in a second preferred embodiment of the present invention.

Please refer to FIG. 2, which is a structural schematic diagram of an OLED thin film encapsulation structure in a first preferred embodiment of the present invention. The OLED thin film encapsulation structure of the present preferred embodiment comprises a substrate 201, a first organic layer 202, a first inorganic layer 203, a second organic layer 204, and a second inorganic layer 205.

In the embodiment, the substrate 201 is a glass substrate or a plastic transparent substrate.

The first organic layer 202 is disposed on the substrate 201. Specifically, the first organic layer 202 is formed by using methods of printing, IJP, spray, coating and so on, which has a thickness ranged from 100 nm to 1000 nm.

The first inorganic layer 203 is disposed on the first organic layer 202 and the substrate 201. The first inorganic layer 203 is a hydrophobic layer, which is formed by using an atomic layer deposition technology or a chemical vapor deposition technology. A thickness of the hydrophobic layer is ranged from 400 nm to 4000 nm.

The second organic layer 204 is disposed on the first inorganic layer 203. Specifically, the second organic layer 202 consists of a plurality of first protrusions with intervals and arranged in an array. The first protrusions can be spherical, semi-spherical, spheroidal, or semi-ellipsoidal in shape, which are formed and printed by using an ink spray printing machine. Further, a curing device is disposed near a nozzle of the ink spray printing machine, such that the nozzle can print and a curing can be performed simultaneously. A thickness of the first organic layer 202 is ranged from 100 nm to 1000 nm. A refractive index of the first organic layer 202 is different from that of the second organic layer 204. Further, an average of an refractive index of any neighboring two first protrusions in each of the first protrusions of the second organic layer 204 is identical to an refractive index of the first organic layer 202, and a deviation value of the refractive index of each of the first protrusions relative to the first organic layer 202 is between 3% and 5% of the refractive index of the first organic layer 202.

The second inorganic layer 205 is disposed on the first inorganic layer 203 and the second organic layer 204. The second inorganic layer is a hydrophobic layer, which is formed by using an atomic layer deposition technology or a chemical vapor deposition technology. A thickness of the hydrophobic layer is ranged from 400 nm to 4000 nm. A surface of the second inorganic layer 205 facing the second organic layer 204 is formed with a plurality of second grooves (not shown) disposed, which are aligned with the first protrusions. Each of the first protrusions 106 is aligned with and fitted with one of the second grooves. A plurality of third protrusions 206 are disposed on a surface of the second inorganic layer 205 away from the second organic layer 204. Each of the third protrusions 206 is aligned with and facing one of the second grooves. Shapes and sizes of the second grooves are all similar or identical to those of the corresponding third protrusions.

From above, microstructures are formed by disposing a plurality of first protrusions on the second organic layer in the OLED thin film encapsulation structure in an embodiment of the present invention, so as to achieve the purposes of increasing a brightness of light emitting and improving an efficiency of light emitting.

From above, microstructures are formed by disposing a plurality of first protrusions on the first organic layer in the OLED thin film encapsulation structure in an embodiment of the present invention, so as to achieve the purposes of increasing a brightness of light emitting and improving an efficiency of light emitting.

The present invention further provides a method of fabricating an OLED thin film encapsulation structure, comprising steps of:
forming a first organic layer on a substrate;
forming a first inorganic layer on the first organic layer and the substrate, wherein the first inorganic layer is a hydrophobic layer;
forming a second organic layer on the first inorganic layer;
forming a second inorganic layer on the first inorganic layer and the second organic layer, wherein the second inorganic is a hydrophobic layer; and
a plurality of first protrusions disposed with intervals on the first organic layer and/or the second organic layer.

Figure 3:
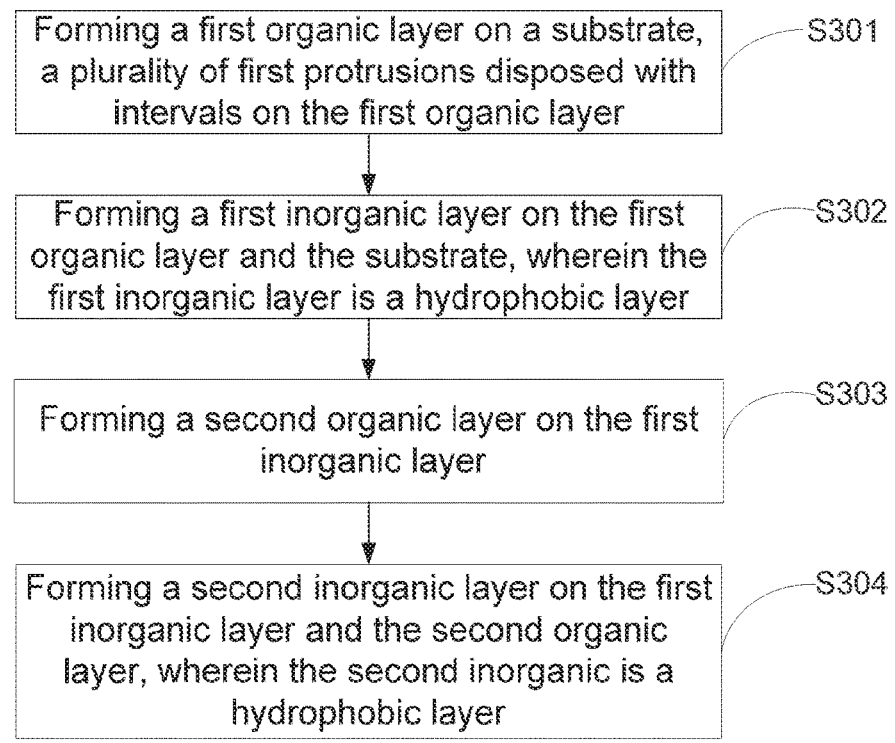
FIG. 3 is a flow chart of a method of fabricating an OLED thin film encapsulation structure in a first preferred embodiment of the present invention.

As shown in FIG. 3, the method of fabricating the OLED thin film encapsulation structure of the first preferred embodiment of the present invention comprises following steps of:
S301: forming a first organic layer on a substrate, a plurality of first protrusions disposed with intervals on the first organic layer.
S302: forming a first inorganic layer on the first organic layer and the substrate, wherein the first inorganic layer is a hydrophobic layer.
S303: forming a second organic layer on the first inorganic layer.
S304: forming a second inorganic layer on the first inorganic layer and the second organic layer, wherein the second inorganic layer is a hydrophobic layer.

Each of the steps of the present method will be described in detail in combination with FIGS. 3A-3D.

Figure 3A:
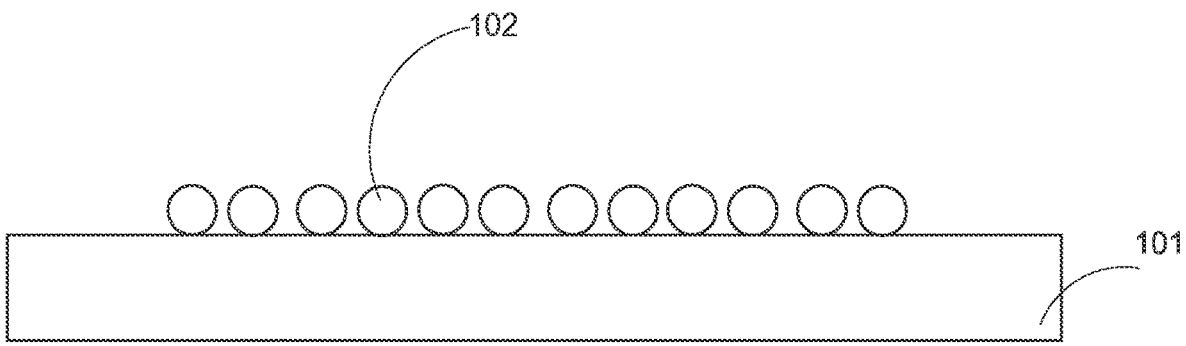
FIG. 3A-3D are schematic diagrams of a method of fabricating the OLED thin film encapsulation structure described in FIG. 3.

In step S301, the first organic layer 102 consists of a plurality of first protrusions with intervals and arranged in an array. The first protrusions are arranged in a rectangular array. The first protrusions can be spherical, semi-spherical, spheroidal, or semi-ellipsoidal in shape, which are formed and printed by using an ink spray printing machine. Further, a curing device is disposed near a nozzle of the ink spray printing machine, such that the nozzle can print and a curing can be performed simultaneously. A thickness of the first organic layer 102 is ranged from 100 nm to 1000 nm. As shown in FIG. 3A, go to step S302.

Figure 3B:
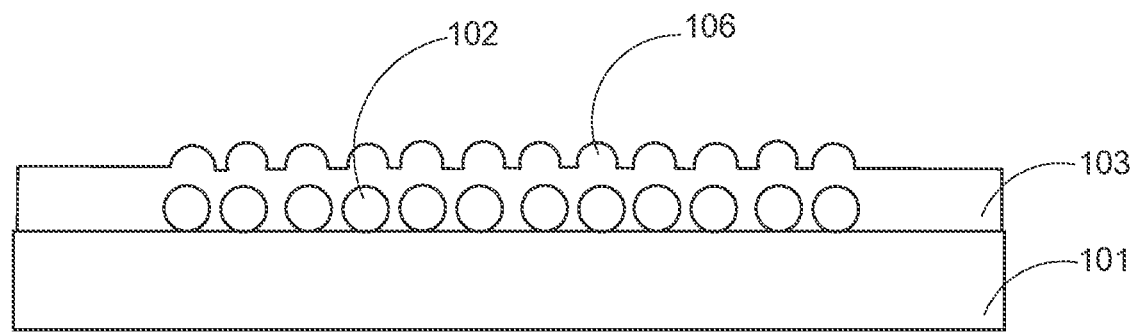

In the step S302, the first inorganic layer is formed by using an atomic layer deposition technology or a chemical vapor deposition technology. A thickness of the hydrophobic layer is ranged from 400 nm to 4000 nm. A plurality of second protrusions are disposed on a surface of the first inorganic layer 102 away from the first organic layer 103, and each of the second protrusions 106 is aligned with and facing one of the first protrusions. In the present embodiment, the second protrusions 106 are hemispherical or semi-ellipsoidal in shape. As shown in FIG. 3B, go to step S303.

Figure 3C:
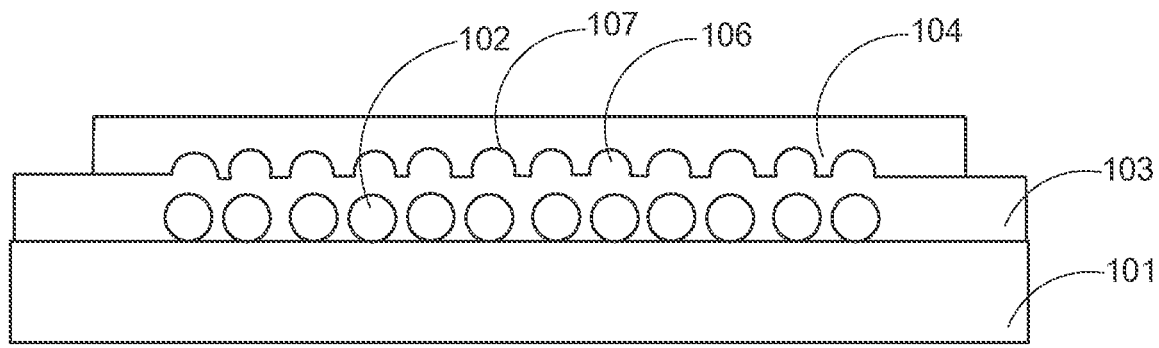

In the step S303, the second organic layer 104 is formed by using methods of printing, IJP, spray, coating and so on, which has a thickness ranged from 100 nm to 1000 nm. A surface of the second organic layer facing the first inorganic layer is formed with a plurality of first grooves 107 disposed, each of the second protrusions 106 is aligned with and fitted with one of the first grooves 107. As shown in FIG. 3C, go to step S304.

Figure 3D:
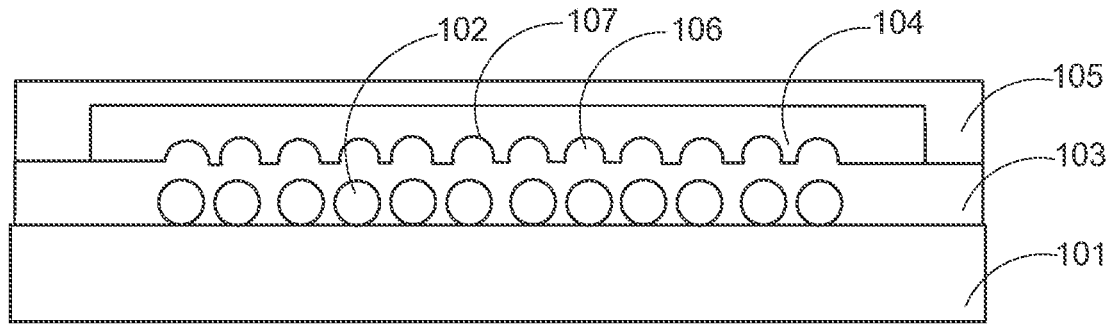

In the step S304, the second inorganic layer 105 is formed by using an atomic layer deposition technology or a chemical vapor deposition technology. A thickness of the hydrophobic layer is ranged from 400 nm to 4000 nm. As shown in FIG. 3D.

Figure 4:
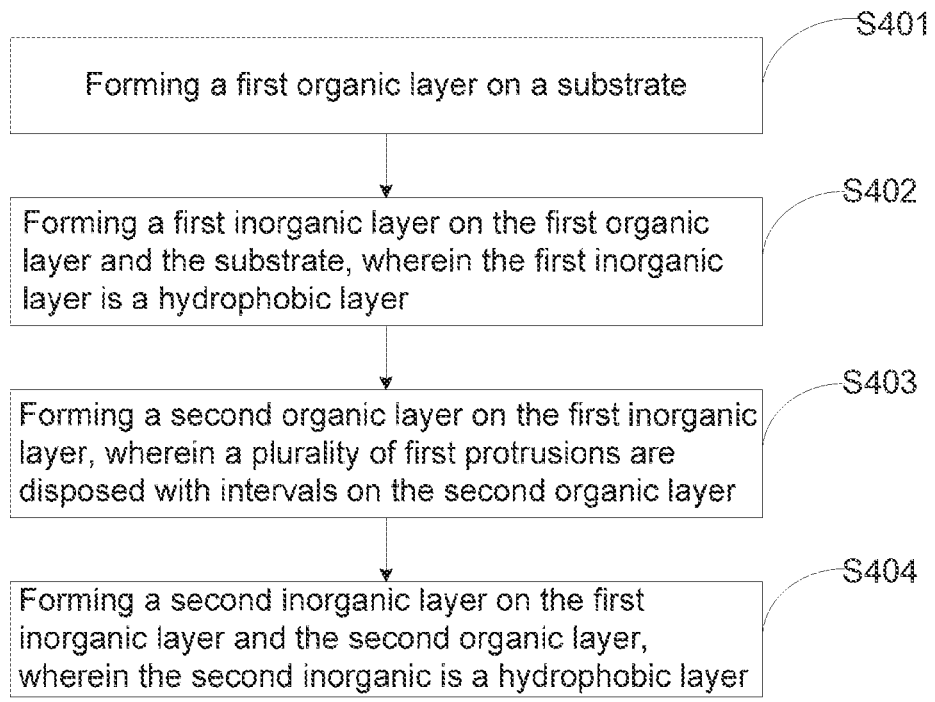
FIG. 4 is a flow chart of a method of fabricating an OLED thin film encapsulation structure in a second preferred embodiment of the present invention.

As shown in FIG. 4, a method of fabricating an OLED thin film encapsulation structure of a second preferred embodiment of the present invention comprises following steps of:
S401: forming a first organic layer on a substrate.
S402: forming a first inorganic layer on the first organic layer and the substrate, wherein the first inorganic layer is a hydrophobic layer.

S403: forming a second organic layer on the first inorganic layer, wherein a plurality of first protrusions are disposed with intervals on the second organic layer.

S404: forming a second inorganic layer on the first inorganic layer and the second organic layer, wherein the second inorganic is a hydrophobic layer.

Each of steps of the present method will be described in detail in combination with FIGS. 4A-4D.

Figure 4A:
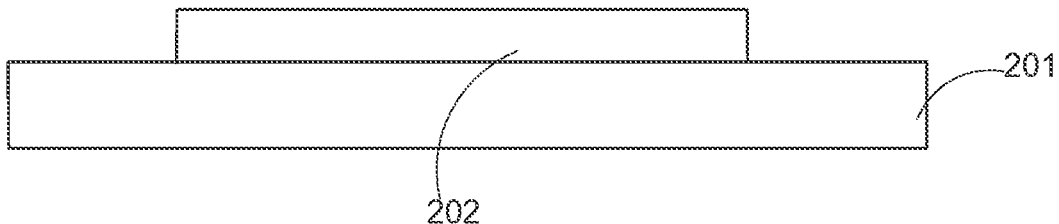
FIG. 4A-4D are schematic diagrams of a method of fabricating the OLED thin film encapsulation structure described in FIG. 4.

In the step S401, the first organic layer 202 is formed by using methods of printing, IJP, spray, coating and so on, which has a thickness ranged from 100 nm to 1000 nm. As shown in FIG. 4A, go to step S402.

Figure 4B:
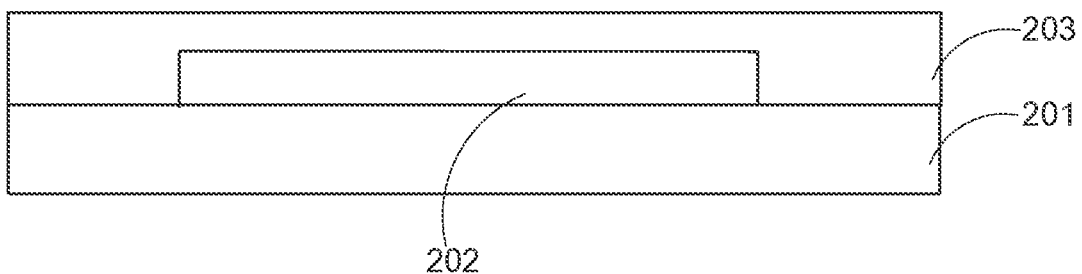

In the step S402, the second inorganic layer 203 is formed by using an atomic layer deposition technology or a chemical vapor deposition technology. A thickness of the hydrophobic layer is ranged from 400 nm to 4000 nm. As shown in FIG. 4B, go to step S403.

Figure 4C:
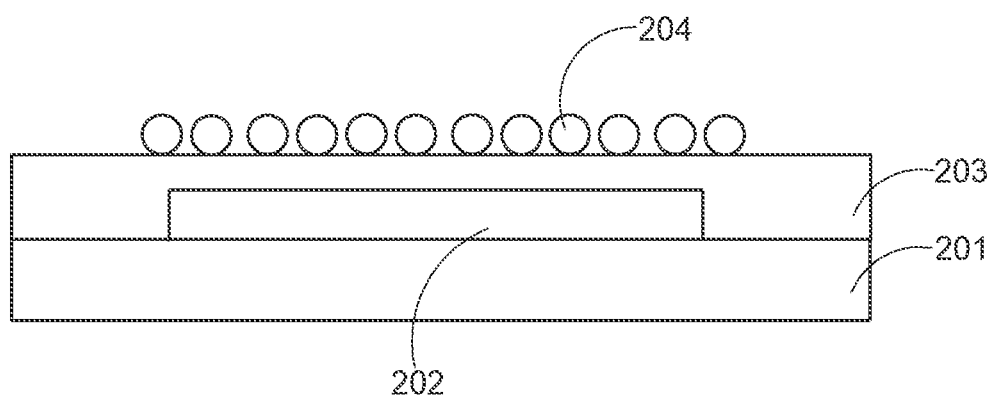

In the step S403, the second organic layer 202 consists of a plurality of first protrusions with intervals and arranged in an array. The first protrusions can be spherical, semi-spherical, spheroidal, or semi-ellipsoidal in shape, which are formed and printed by using an ink spray printing machine. Further, a curing device is disposed near a nozzle of the ink spray printing machine, such that the nozzle can print and a curing can be performed simultaneously. A thickness of the second organic layer 202 is ranged from 100 nm to 1000 nm. As shown in FIG. 4C, go to step S404.

Figure 4D:
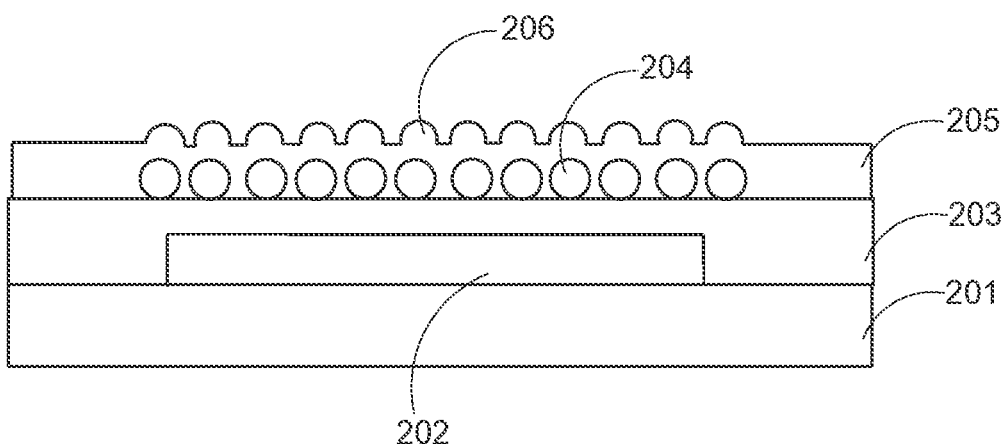

In the step S404, the second inorganic layer 205 is formed by using an atomic layer deposition technology or a chemical vapor deposition technology. A thickness of the hydrophobic layer is ranged from 400 nm to 4000 nm. A surface of the second inorganic layer 205 facing the second organic layer 204 is formed with a plurality of second grooves (not shown) disposed, which are aligned with the first protrusions. Each of the first protrusions 106 is aligned with and fitted with one of the second grooves. A plurality of third protrusions 206 are disposed on a surface of the second inorganic layer 205 away from the second organic layer 204. Each of the third protrusions 206 is aligned with and facing one of the second grooves. Shapes and sizes of the second grooves are all similar or identical to those of the corresponding third protrusion, as shown in FIG. 4D.

From above, microstructures are formed by disposing a plurality of first protrusions on the second organic layer in the method of fabricating the OLED thin film encapsulation structure in an embodiment of the present invention, so as to achieve the purposes of increasing a brightness of light emitting and improving an efficiency of light emitting.

From above, microstructures are formed by disposing a plurality of first protrusions on the first organic layer in the method of fabricating the OLED thin film encapsulation structure in an embodiment of the present invention, so as to achieve the purposes of increasing a brightness of light emitting and improving an efficiency of light emitting.

As described above, although the present invention has been described in preferred embodiments, they are not intended to limit the invention. One of ordinary skill in the art, without departing from the spirit and scope of the invention within, can make various modifications and variations, so the range of the scope of the invention is defined by the claims.

What is claimed is:

1. An OLED thin film encapsulation structure, comprising:
    a substrate;
    a first organic layer disposed on the substrate;
    a first inorganic layer disposed on the first organic layer and the substrate, wherein the first inorganic layer is a hydrophobic layer;
    a second organic layer disposed on the first inorganic layer;
    a second inorganic layer disposed on the first inorganic layer and the second organic layer,
    wherein the second inorganic layer is a hydrophobic layer; and
    a plurality of first protrusions disposed with intervals on the first organic layer,
    wherein a plurality of second protrusions are disposed on a surface of the first inorganic layer away from the first organic layer, and each of the second protrusions is aligned with and facing one of the first protrusions; a surface of the second organic layer facing the first inorganic layer is formed with a plurality of first grooves disposed, each of the second protrusions is aligned with and fitted with one of the first grooves, and each of the second protrusions is correspondingly received in one of the first grooves, respectively;
    wherein a refractive index of the first organic layer is different from that of the second organic layer, an average of a refractive index of any neighboring two first protrusions in each of the first protrusions is identical to a refractive index of the second organic layer, and
    a deviation value of the refractive index of each of the first protrusions relative to the second organic layer is between 3% and 5% of the refractive index of the second organic layer.

2. The OLED thin film encapsulation structure according to claim 1, wherein the first protrusions are spherical, semi-spherical, spheroidal, or semi-ellipsoidal in shape.

3. The OLED thin film encapsulation structure according to claim 2, wherein the first protrusions are arranged in a rectangular array.

4. The OLED thin film encapsulation structure according to claim 1, wherein the first protrusions are arranged in a rectangular array.

5. The OLED thin film encapsulation structure according to claim 1, wherein the plurality of first protrusions are disposed with the intervals on the first organic layer, a plurality of second protrusions are disposed on a surface of the first inorganic layer away from the first organic layer, and each of the second protrusions is aligned with and facing one of the first protrusions; a surface of the second organic layer facing the first inorganic layer is formed with a plurality of first grooves disposed, each of the second protrusions is aligned with and fitted with one of the first grooves, and each of the second protrusions is correspondingly received in one of the first grooves, respectively.

* * * * *